United States Patent [19]

Homma

[11] Patent Number: 5,407,529
[45] Date of Patent: Apr. 18, 1995

[54] METHOD FOR MANUFACTURING SEMICONDUCTOR DEVICE

[75] Inventor: Tetsuya Homma, Tokyo, Japan

[73] Assignee: NEC Corporation, Tokyo, Japan

[21] Appl. No.: 27,728

[22] Filed: Mar. 4, 1993

[30] Foreign Application Priority Data

Mar. 4, 1992 [JP] Japan .................................. 4-046506

[51] Int. Cl.⁶ ...................... H01L 21/306; B44C 1/22; C03C 15/00
[52] U.S. Cl. .................................... 156/643; 156/653; 156/657; 156/661.1; 156/904; 437/229
[58] Field of Search ............... 156/630, 643, 652, 653, 156/657, 661.1, 668, 662, 904; 437/229

[56] References Cited

FOREIGN PATENT DOCUMENTS 0025543  1/1989  Japan .

*Primary Examiner*—William Powell
*Attorney, Agent, or Firm*—Popham, Haik, Schnobrich & Kaufman, Ltd.

[57] ABSTRACT

In a pattern formation method which employs a resist system of tri-level structure the present method is characterized in that it uses a fluorine contained silicon dioxide film as the intermediate film. Since this fluorine contained silicon dioxide film can be formed at a low temperature with a small volume shrinkage, it is possible to eliminate the generation of cracks and delaminations due to heat treatment. Moreover, it is possible to improve the adhesive strength between an etching object such as a noble metal film and the lower organic film since the lower organic film can be formed by heat treatment at a low temperature.

11 Claims, 4 Drawing Sheets

METHOD FOR MANUFACTURING SEMICONDUCTOR DEVICE

BACKGROUND OF THE INVENTION

1. Field of the Invention

The present invention relates to a method for manufacturing a semiconductor device, and more particularly to a method for forming a fine pattern consisting of an insulating film, a metallic film or the like.

2. Description of the Prior Art

In the manufacturing process of a semiconductor device, a mask consisting of a photoresist is in general use in order to form a pattern by etching a film to be etched such as an insulating film, a metallic film or the like deposited on a semiconductor substrate. Namely, after forming a photoresist film on a film to be etched, a mask consisting of a photoresist is formed by selectively irradiating the film with ultraviolet rays, developing it, and heating it at a temperature of about 130° C.

In recent years unevenness on the surface of a semiconductor substrate is becoming more conspicuous due to complexity and refinement of the semiconductor device. In order to form a fine film pattern by etching with high accuracy, it is necessary to use a thin photoresist film which enables one to produce an accurate mask. However, when the unevenness of the substrate surface is large, the patterning accuracy of the photoresist film is deteriorated due to variation in the thickness of the photoresist film on the substrate surface caused by the unevenesss, impairing the patterning accuracy of the film to be etched. As a countermeasure to this problem, there has been examined a pattern formation method by means of a resist system with tri-level structure. In the resist system with tri-level structure a coating film such as spin on glass (SOG) is mainly used as the intermediate layer.

In the method that uses a resist system with tri-level structure, first, unevenness on a film to be etched is flattened by coating it with a photoresist film of about 2 $\mu$m thickness, and then heated at 200° C. for one hour to form a lower resist film. Next, an intermediate layer consisting of an SOG film is formed by coating a solution having silanol as a principal component to a thickness of about 0.2 $\mu$m, then curing the coating by heating it at 150° C. for one hour. Following that, after forming an upper resist film of thickness 0.3 $\mu$m, the upper resist film is patterned by photolithography. Next the intermediate layer is etched by reactive ion etching (RIE) using CF$_4$ gas with the upper resist layer as the mask. Further, the lower resist film is dry etched using O$_2$ gas with the intermediate layer as the mask. By the process in the above, a mask consisting of a lower resist film with improved dimensional accuracy can be obtained.

However, the aforementioned method of forming a mask consisting of a lower resist film using the resist system of tri-level structure, has the following problems.

Namely, the coating film used as the intermediate film develops cracks or delaminations at the time of its heat treatment due to volume shrink by heating or mismatch in the coefficient of thermal expansion with the lower resist film. Moreover, for heat treatment of the coating film at a temperature below 200° C., perfect condensation reaction does not take place so that sufficient strength can no longer be obtained. Because of these, the coating film is delaminated and becomes the cause of generation of particles.

Furthermore, when the film to be etched is a film of a noble metal such as gold, there is a problem in that heating of the lower resist film at a temperature above 150° C. causes the delamination of the film. This results in the deterioration of the production yield and the reliability of the semiconductor device.

BRIEF SUMMARY OF THE INVENTION

Object of the Invention

It is the object of this invention to provide a method for manufacturing a semiconductor device with improved yield and reliability, where in pattern formation using a resist system with tri-level structure, generation of cracks or delaminations in the intermediate layer is minimized by forming the intermediate layer at a low temperature so as to have small volume shrinkage, and to eliminate delamination in the underlying organic film even when it is formed on a film of a noble metal.

Summary of the Invention

This invention provides a method for manufacturing a semiconductor integrated circuit device in which an organic film and a fluorine contained silicon dioxide film are formed sequentially on a semiconductor substrate having a film to be etched on the surface thereof, the fluorine contained silicon dioxide film is pattern, then the organic film is dry etched using the fluorine contained silicon dioxide film as the mask, and the film to be etched is dry etched using the organic film as the mask.

The fluorine contained silicon dioxide film has a higher absorption peak intensity of the Si-O bonding and a lower absorption peak intensity of the OH group compared with the SOG film used as the intermediate layer of the resist system of the conventional tri-level structure, as shown in FIG. 4, and the density of the Si—O bonding is increased by 40 to 50% compared with that of the SOG film. Since this value is comparable to that of the conventional SOG film subjected to heat treatment at 300° C., it is possible to reduce the heat treatment temperature of the fluorine contained silicon dioxide film of this embodiment to below 150° C. Moreover, in contrast to a volume shrinkage of 15 to 20% of the conventional SOG film by a heat treatment at 150° C. for 30 minutes, the shrinkage of the fluorine contained silicon dioxide film is 0 to 3%. Furthermore, the strength of the film is greater by 40 to 50% compared with that of the conventional SOG film, so that there is hardly any generation of cracks in the film caused by the heat treatment.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Figure 1A:
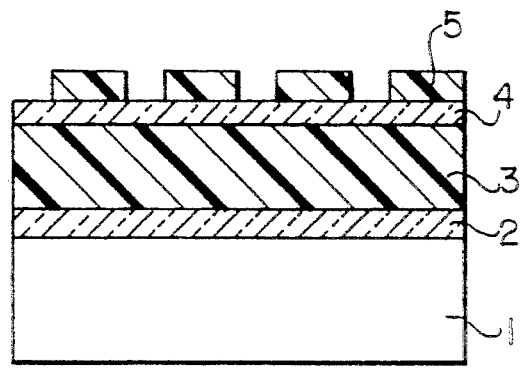
FIG. 1(a–d) is a sectional diagram of the semiconductor chip for explaining a first embodiment of the invention.

Turning to FIG. 1(a), according to the first embodiment of the invention, first, a silicon dioxide film 2 with thickness of about 0.8 μm is formed as a film to be etched by a chemical vapor deposition (CVD) method on a semiconductor substrate 1 consisting of silicon or the like. Next, after forming a photoresist film by spin coating method, the substrate is heated in an $N_2$ gas atmosphere at 150° C. for 30 minutes to form a lower resist film 3 with thickness of about 1.5 μm. Next, the surface of the lower resist film 3 is modified by exposing the substrate to the vapor of an organic silane such as hexamethyldisilazane or an organic siloxane such as hexamethyldisiloxane. Next, by immersing the substrate for about eight hours in hydrofluorosilicic acid solution (concentration of about 3.5 mol/l) kept at 20° to 40° C. while adding continuously boric acid solution (concentration of about 0.1 mol/l) in order to supersaturate the solution, a fluorine contained silicon dioxide film 4 with thickness of about 0.2 μm is formed on the lower resist film 3 as an intermediate film. Next, after forming an upper resist film 5 with thickness of about 0.3 μm, an opening pattern with diameter of about 0.3 μm is formed by lithography technique. Next, the upper resist film is heated in an atmosphere of $N_2$ gas at 130° C. for 30 minutes.

Figure 1B:
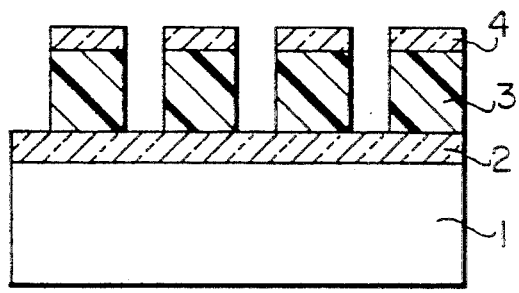

As shown in FIG. 1(b), the pattern is transferred by selective etching of the fluorine contained silicon dioxide film 4 by an RIE method using $CF_4$ gas or an etching method using electron cyclotron resonance (ECR) with the upper resist film as the mask. Next, the lower resist film 3 is etched by an RIE method using $O_2$ gas carried out under a pressure of about 5 Pa, transferring the pattern and at the same time removing the upper resist layer 5.

Figure 1C:
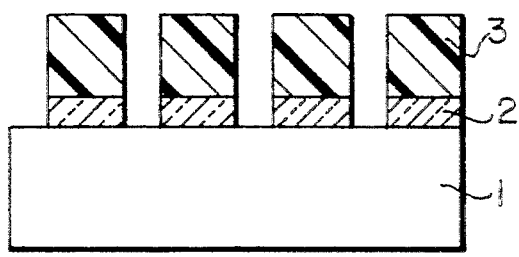
Figure 1D:
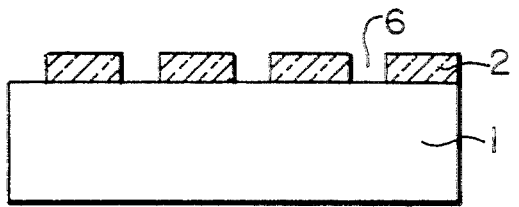

Next, as shown in FIG. 1(c), the silicon dioxide film 2 which is the film to be etched is selectively etched by an RIE method using $CF_4$ gas to transfer the pattern and to remove simultaneously the fluorine contained silicon dioxide film 4. Finally as shown in FIG. 1(d), a silicon dioxide film 2 having a fine opening 6 is obtained by removing the lower resist film 3 by ashing it in an $O_2$ plasma.

In this way, according to the first embodiment, it is possible to form a fluorine contained silicon dioxide film 4 as an intermediate film at room temperature with absolutely no delamination and yet with nonuniformity of less than 2% of the film thickness. In addition, since the fluorine contained silicon dioxide film 4 will not generate shrink or cracks by heat treatment, the diameter of the opening 6 formed in the silicon dioxide film 2 had a satisfactory result of about 0.32 μm.

Next, the second embodiment in which this invention is applied to the formation of a two-level wiring will be described by using FIG. 2(a) through FIG. 2(d).

Figure 2A:
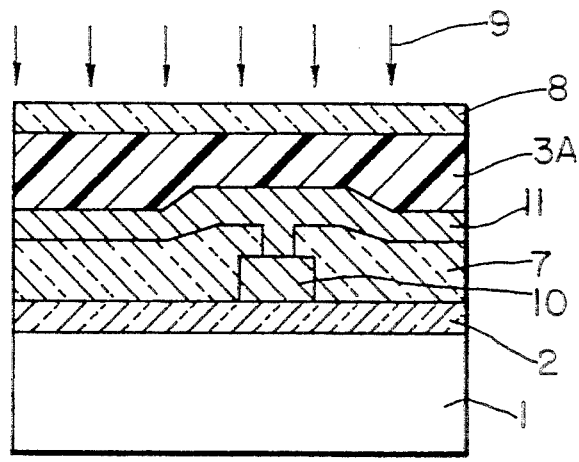
FIG. 2(a–d) is a sectional diagram of the semiconductor chip for explaining a second embodiment of the invention.

First, as shown in FIG. 2(a), a silicon dioxide film 2 with thickness of about 0.8 μm is formed on the substrate 1 by a CVD method. Next, a lower wiring 10 with thickness of about 0.7 μm consisting of Al—Si—Cu, an interlayer insulating film 7 consisting of $SiO_2$ formed by a CVD method, and an upper wiring film 11 with thickness of about 0.7 μm consisting of Al—Si—Cu are formed sequentially. At this time, a step height of about 0.7 μm is generated in the upper wiring film.

Next, a solution having silanol $Si(OH)_4$ as the principal ingredient is coated on a lower resist film 3A by spin coating method and the substrate is heated for about one minute over a hot plate kept at 100° C., and the substrate is exposed at room temperature to ga vapor 9 having triethoxyfluorosilane $FSi(OC_2H_5)_3$ as the principal ingredient for 10 minutes. Next, by heating at 100° to 150° C. for 30 minutes, a fluorine contained SOG film 8 with thickness of about 0.2 μm containing small amount of residual moisture component (OH group, Si—OH bonding) is formed.

Figure 2B:
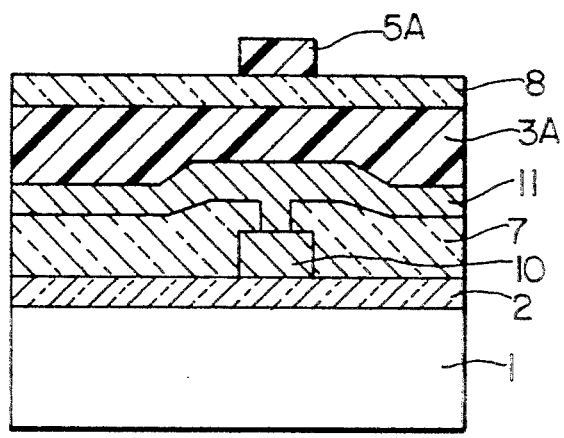
Figure 2C:
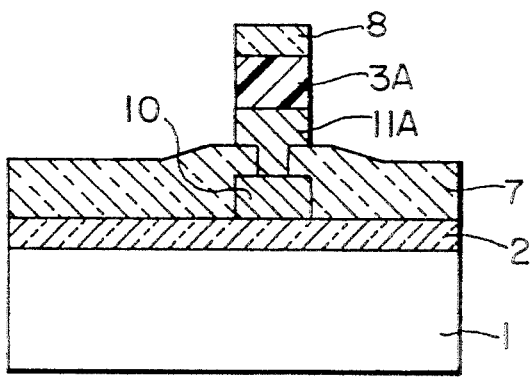
Figure 2D:
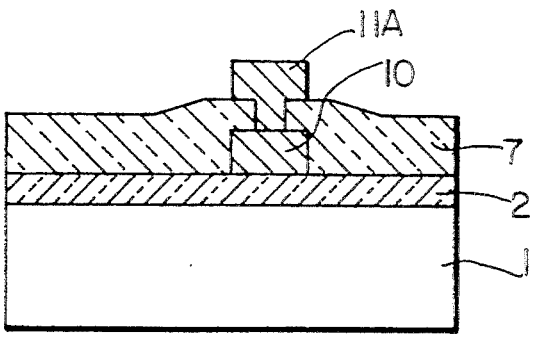

Next, as shown in FIG. 2(b), after forming a resist film with thickness of about 0.3 μm, an upper resist film 5A is formed by patterning using lithography technique. Next, as shown in FIG. 2(c), after heating the upper resist film 5A in an $N_2$ atmosphere at 130° C. for 30 minutes, the pattern is transferred by selectively etching the fluorine contained SOG film 8 by an RIE method using $CF_4$ gas. Following that, by selectively etching the lower resist film 3A by an RIE method using $O_2$ gas, the pattern is transferred and the upper resist film 5A is removed simultaneously. Next, the upper wiring film 11 is etched by an RIE method using chlorine-based gas such as $CCl_4$ to form an upper wiring 11A. Finally, after, removing the fluorine contained SOG film 8 by an RIE method using $CF_4$ gas, the lower resist film 3A is removed by ashing it in an $O_2$ plasma, completing a two-level wiring as shown in FIG. 2(d).

As in the above, according to the second embodiment, it is possible to form a high quality SOG film 8 containing fluorine at a temperature below 150° C., so the shrinkage and the strength can be improved similar to the case of the fluorine contained silicon dioxide film in the first embodiment. The upper wiring 11A formed by the above-mentioned process is hardly affected by the step height (about 0.7 μm) generated by the lower wiring film or the like, and the dimensional error against the design dimension of 0.6 μm was an extremely satisfactory value of ±0.05 μm in contrast to the conventional value of ±0.1 μm. Moreover, when an upper wiring with wiring spacing 0.4 μm and wiring width 0.6 μm was formed, there occurred absolutely no failure such as disconnection or short-circuiting.

Next, using FIG. 3(a) through FIG. 3(d), the third embodiment in which the invention is applied to the formation of a gold wiring will be described.

Figure 3A:
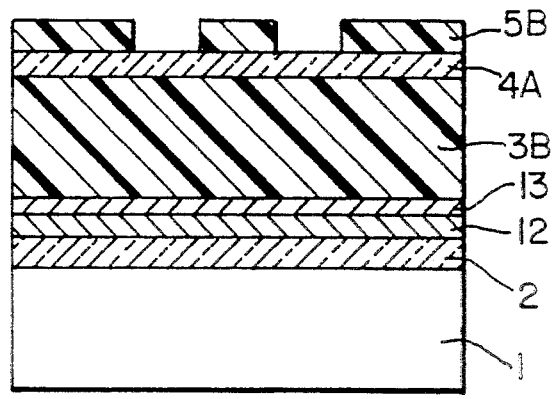
FIG. 3(a–d) is a sectional diagram of the semiconductor chip for explaining a third embodiment of the invention.

First, as shown in FIG. 3(a), silicon dioxide film 2 with thickness of about 0.8 μm is formed by a CVD method on a semiconductor substrate 1. Next, about 0.2 μm-thick titanium-containing tungsten (Ti—W) film 12 and about 0.1 μm-thick gold (Au) film 13 are formed sequentially both by sputtering. Next, a photoresist film is coated, and about 1.5 μm-thick lower resist film 3B is formed by heating in an $N_2$ atmosphere at 130° C. for 60 minutes. In this case it is preferable that the heating temperature does not exceed 150° C. since the adhesive strength between the lower resist film 3B and the Au film 13 deteriorates and delamination takes place if the temperature is higher than 150° C. Next, an about 0.2 μm-thick fluorine contained silicon dioxide film 4A is formed by a CVD method using triethoxyfluorosilane and pure water as the gas sources, under the conditions of substrate temperature 25° C. and pressure about 5 Pa. Following that, after forming an about 0.3 μm-thick photoresist film, an upper resist film 5B is formed by patterning that employs the lithography technique.

Figure 3B:
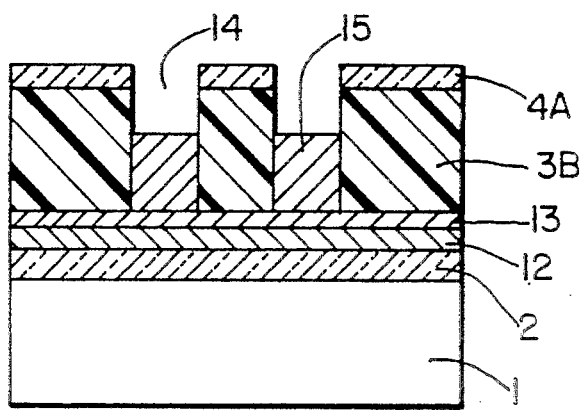

Next, as shown in FIG. 3(b), after heating the upper resist film 5B in an $N_2$ atmosphere at 130° C. for 30 minutes, the fluorine contained silicon dioxide film 4A is selectively etched by an RIE method using $CF_4$ gas, and the pattern is transferred. Next, the lower resist film 3B is etched by an RIE method that uses $O_2$ gas under the pressure of about 5 Pa, to transfer the pattern and form a trench 14, and to remove the upper resist film 5B at the same time. Next, an about 1 μm-thick Au plated film 15 is formed in the trench 14 by electroplating method which uses the Ti—W film 12 and the Au film 13 as the electrode.

Figure 3C:
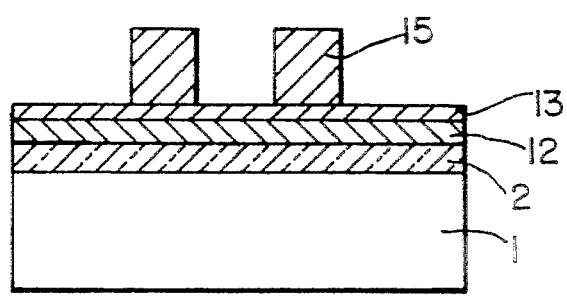
Figure 3D:
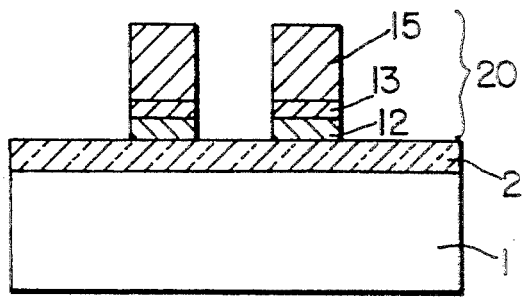
Figure 4:
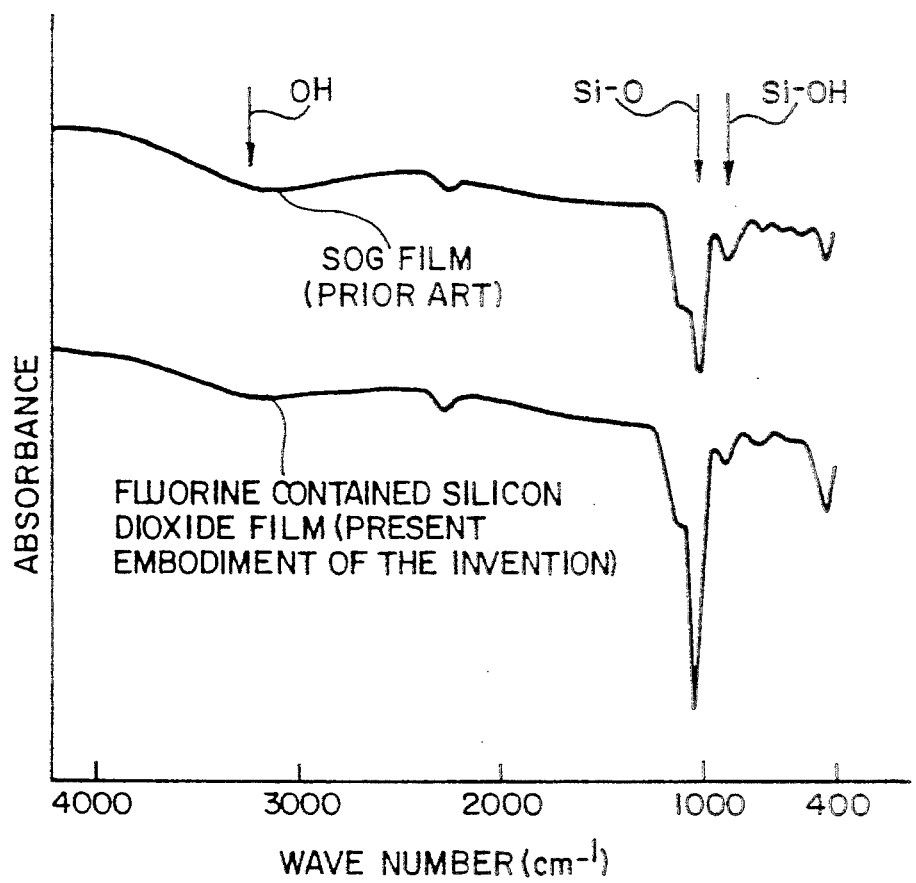
FIG. 4 is a diagram showing the infrared absorption spectra of silicon dioxide films used in the prior art and in this invention.

Next, as shown in FIG. 3(c), after removing the fluorine contained silicon dioxide film 4A by the use of 10% hydrofluoric acid solution, the lower resist film 3B is removed by ashing it in an $O_2$ plasma. Next, the Au film 13 is removed by an ion milling method except for the part that becomes the wiring. Finally, by removing the Ti—W film 12 except for the part that becomes the wiring by an RIE method using a fluorine-based gas, forming an Au wiring 20 as shown in FIG. 3(d).

As in the above, since the fluorine contained silicon dioxide film 4A can be formed by a low temperature CVD method according to the third embodiment, it is possible to form the lower resist film 3B at a temperature below 150° C. Accordingly, when an Au wiring of width 0.7 μm was formed, there occurred absolutely no failure such as disconnection or short-circuiting because the delamination of the Au film 13 from the lower resist film 3B can be eliminated.

In each of the aforementioned embodiments a photoresist film is used as the organic film on the film to be etched. However, instead of it a polyimide resin film, a polystyrene resin film, or a film of electroconductive polymer such as polyacetylene or polypyrrole can also be used.

In addition, the film to be etched can be an insulating film such as a silicon dioxide film, a silicon nitride film, a tantalum oxide film, or the like that is used in the manufacturing process of semiconductor devices, or can be an electroconductive film such as a polysilicon film, an Al film, a TiN film, or the like.

Moreover, in the second embodiment silanol was used in the formation of the SOG film, but it may be replaced by a compound with structural formula $Si(OR)_4$ (R is an alkyl group) such as tetramethoxydisilane, or a compound with structural formula $R_nSi(OR)_{4-n}$ (R is an alkyl group and n is an integer from 1 to 3) such as monomethyltriethoxysilane.

Furthermore, in the second and the third embodiments use was made of triethoxyfluorosilane, but other alkoxyfluorosilane such as trimethoxyfluorosilane or trinormalpropoxysilane may also be used.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that appended claims will cover any modifications or embodiments as fall within the true scope of the invention.

I claim:

1. A method for manufacturing a semiconductor device comprising the steps of:
    forming a silicon oxide film on an organic film oxide film formed on a film to be selectively etched, said silicon oxide film containing fluorine;
    patterning said silicon oxide film to form a patterned silicon oxide film;
    etching said organic film by a dry etching method using said patterned silicon oxide film as a mask; and
    etching said film to be etched by a dry etching method using the remaining organic film as a mask.

2. A method for manufacturing a semiconductor as claimed in claim 1, wherein said organic film consists of at least one of a photoresist film, a polyimide resin film, a polystyrene resin film, and an electroconductive polymer film.

3. A method for manufacturing a semiconductor device as claimed in claim 1, wherein the step of forming said silicon oxide film includes a step in which after said organic film is exposed to the vapor of organic silane or organic siloxane a semiconductor substrate is immersed in a solution of hydrofluorosilicic acid which is in a super-saturated state.

4. A method for manufacturing a semiconductor device as claimed in claim 1, wherein said step of forming fluorine contained silicon dioxide includes a step in which after a solution having at least one of $Si(OR)_4$, $R_nSi(OR)_{4-n}$, and $Si(OH)_4$ (R is an alkyl group which needs not to have the same structure, and n is an integer from 1 to 3) as the principal ingredient is coated on said organic film, the substrate is exposed to a vapor having alkoxyfluorosilane (chemical formula is $FSi(OR)_{4-n}$ where R is an alkyl group and n is an integer from 1 to 3), and a step of subjecting the substrate to a heat treatment.

5. A method for manufacturing a semiconductor device as claimed in claim 1, wherein said step of forming fluorine contained silicon dioxide film includes a chemical vapor deposition method which uses alkoxyfluorosilane and water as the gas sources.

6. A method for manufacturing a semiconductor device comprising the steps of:
    forming a first wiring layer on an insulator film covering a semiconductor substrate;
    forming an interlayer insulating film to cover said insulator film and said first wiring layer;
    forming a contact hole in said interlayer insulating film to expose a part of said first wiring layer;
    forming on said interlayer insulating film a conductive layer having a portion which is in contact with said part of said first wiring layer through said contact hole;
    forming a mask layer on said conductive layer, said mask layer covering one part of said conductive layer and exposing a remaining part of said conductive layer, said one part of said conductive layer having said portion being in contact with said part of first wiring layer through said contact hole;
    selectively removing said conductive layer by using said mask layer as a mask to thereby form a second wiring layer having said portion being in contact with said part of said first wiring layer; and
    removing said mask layer;
    said step of forming said masks layer including the steps of:
        forming a first photoresist film on said conductive layer;
        forming a fluorine-contained silicon oxide film on said photoresist film;

selectively forming a second photoresist film on said fluorine-contained silicon oxide film;

selectively removing said fluorine-contained silicon oxide film by using said second photoresist film as a mask to form a patterned fluorine-contained silicon oxide film; and selectively removing said first photoresist film by using said patterned fluorine-contained silicon oxide film as a mask.

7. The method as claimed in claim 6, wherein said fluorine-contained silicon oxide film is formed by immersing said substrate having said first photoresist film into a hydrofluorosilicic acid solution which is kept in fluorine in a supersaturated condition.

8. The method as claimed in claim 6, wherein said fluorine-contained silicon oxide film is formed by coating a spin-on-glass film on said first photoresist film and then subjecting said spin-on-glass film to a vapor having alkoxyfluorosilane.

9. A method for manufacturing a semiconductor device comprising the steps of:

forming a conductive layer on an insulating film covering a semiconductor substrate;

forming a mask layer on said conductive film, said mask layer covering one part of said conductive layer and exposing a remaining part of said conductive layer;

selectively plating a metal on said one part of said conductive layer by using said mask layer as a mask to thereby form a plated metal layer;

removing said mask layer; and selectively removing said remaining part of said conductive layer by using said plated metal layer as a mask;

said step of forming said mask layer including the steps of:

forming a first photoresist film on said conductive layer;

forming a fluorine-contained silicon oxide film on said first photoresist film;

selectively forming a second photoresist film on said fluorine-contained silicon oxide film;

selectively removing said fluorine-contained film by using said second photoresist film as a mask to thereby form a patterned fluorine-contained silicon oxide film; and selectively removing said first photoresist film by using said patterned fluorine-contained silicon film as a mask.

10. The method as claimed in claim 9, wherein said fluorine-contained silicon oxide film is formed by immersing said semiconductor substrate having said first photoresist film into a hydrofluorosilicic acid solution which is kept in fluorine in a supersaturated condition.

11. The method as claimed in claim 9, wherein said fluorine-contained silicon oxide film is formed by coating a spin-on-glass film on said first photoresist film and then subjecting said spin-on-glass film to a vapor having a alkoxyfluorosilane.

* * * * *